United States Patent
Miyazawa et al.

(10) Patent No.: US 7,874,653 B2
(45) Date of Patent: Jan. 25, 2011

(54) PIEZOELECTRIC DEVICE, ITS MANUFACTURING METHOD, LIQUID EJECTION HEAD, AND PRINTER

(75) Inventors: Hiromu Miyazawa, Azumino (JP); Toshihito Takagi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/393,471

(22) Filed: Feb. 26, 2009

(65) Prior Publication Data
US 2009/0219348 A1 Sep. 3, 2009

(30) Foreign Application Priority Data
Feb. 29, 2008 (JP) ............... 2008-050891

(51) Int. Cl.
*B41J 2/045* (2006.01)
(52) U.S. Cl. .............. 347/70; 347/20; 347/40; 347/47; 347/48; 347/50; 347/71; 347/72
(58) Field of Classification Search ........... 347/20–85
See application file for complete search history.

(56) References Cited
U.S. PATENT DOCUMENTS 6,109,736 A * 8/2000 Miyata et al. ............ 347/68
6,984,843 B2 * 1/2006 Higuchi et al. .......... 257/16
7,448,731 B2 * 11/2008 Murata .................... 347/68
7,448,733 B2 * 11/2008 Murata et al. ........... 347/71
2003/0156163 A1 * 8/2003 Watanabe et al. ........ 347/68

FOREIGN PATENT DOCUMENTS

| JP | 11-010881 | 1/1999 |
|---|---|---|
| JP | 2001-270113 | 10/2001 |
| JP | 2004-017600 | 1/2004 |
| JP | 2004-160711 | 6/2004 |
| JP | 2006-272659 | 10/2006 |

* cited by examiner

*Primary Examiner*—Ryan Lepisto
*Assistant Examiner*—Guy G Anderson
(74) *Attorney, Agent, or Firm*—Harness, Dickey & Pierce, P.L.C.

(57) ABSTRACT

A piezoelectric device includes a substrate composed of a (110) single crystal silicon, a driver IC formed in the substrate, and a piezoelectric device that is formed above the substrate and is driven by the driver IC, wherein the driver IC has an analog switch including a transistor, the transistor having a channel direction in <001> orientation of the substrate.

7 Claims, 7 Drawing Sheets

PIEZOELECTRIC DEVICE, ITS MANUFACTURING METHOD, LIQUID EJECTION HEAD, AND PRINTER

CROSS-REFERENCE TO RELATED APPLICATION

This application claims a priority to Japanese Patent Application No. 2008-050891 filed on Feb. 29, 2008 which is hereby expressly incorporated by reference herein in its entirety.

BACKGROUND

1. Technical Field

The present invention relates to piezoelectric devices, methods for manufacturing the same, liquid jet heads and printers.

2. Related Art

As apparatuses that use piezoelectric devices, for example, liquid jet heads are known.

A liquid jet head includes a piezoelectric element and an associated pressure chamber communicating with a nozzle aperture, wherein the pressure chamber is pressurized by the piezoelectric element to eject ink droplets through the nozzle aperture. In general, in this type of liquid jet head, operation of the piezoelectric element is controlled by a driver IC (a semiconductor integrated circuit). It is known that the driver IC may be formed independently, and may be electrically connected to the piezoelectric elements by bonding wires or the like. An example of prior art may be Japanese Laid-open Patent Application 2004-17600.

SUMMARY

In accordance with an advantage of some aspects of the invention, a piezoelectric device that is highly reliable and is manufactured by a low cost and simple process, and its manufacturing method can be provided. Also, in accordance with another aspect of the invention, a liquid ejection device and a printer including the piezoelectric device can be provided.

A piezoelectric device in accordance with an embodiment of the present invention includes a substrate composed of a (110) single crystal silicon, a driver IC formed in the substrate, and a piezoelectric device that is formed above the substrate and is driven by the driver IC, wherein the driver IC has an analog switch including a transistor, the transistor having a channel direction that is in <001> crystal orientation of the substrate.

According to the piezoelectric device in accordance with the embodiment described above, the driver IC is formed in the substrate where the pressure chamber is formed, and the channel direction of the transistor formed in the driver IC is in <001> orientation of the (110) single crystal silicon substrate, such that the piezoelectric device is highly reliable and can be manufactured by a low cost and simple process.

In the description of the invention, the term "above" is used, for example, as in a statement "a specific component (hereinafter called 'B') is formed 'above' another specific component (hereinafter called 'A')." In such a case, the term "above" is used in the description of the invention, while assuming to include the case where the component B is formed directly on the component A and the case where the component B is formed over the component A through another component provided on the component A. Similarly, the term "below" is used, while assuming to include the case where the component B is formed directly under in contact with the component A and the case where the component B is formed under the component A through another component.

In the piezoelectric device in accordance with an aspect of the invention, the channel direction of the transistor may be in a range of ±5° with respect to the <001> orientation of the substrate.

In the piezoelectric device in accordance with an aspect of the invention, the driver IC may have a long side and a short side in a plan view, and the long side of the driver IC is orthogonal to the channel direction of the transistor.

A method for manufacturing a piezoelectric device in accordance with an embodiment of the invention includes the steps of: forming a driver IC in a substrate composed of (110) single crystal silicon, and forming above the substrate a piezoelectric element which is driven by the driver IC, wherein the driver IC has an analog switch including a transistor, and the transistor is formed with its channel direction oriented in <001> orientation of the substrate.

According to the method for manufacturing a piezoelectric device in accordance with the present embodiment, the driver IC is formed in the substrate where the pressure chamber is formed, and the transistor provided in the driver IC is formed with a channel direction in <001> orientation of the (110) single crystal silicon substrate. Therefore, the piezoelectric device can be formed by a low cost and simple process with high reliability.

A liquid ejection head in accordance with an embodiment of the invention includes a piezoelectric device in accordance with an embodiment of the invention, and further includes, a pressure chamber formed in the substrate, a vibration plate that is capable of vibrating in an up-down direction by the piezoelectric element, and a nozzle plate that is formed below the substrate and has a nozzle aperture communicating with the pressure chamber.

In the liquid jet head in accordance with an aspect of the invention, the pressure chamber and the driver IC each have a long side and a short side as viewed in a plan view, wherein an extension line of the long side of the pressure chamber is angled with respect to an extension line of the long side of the driver IC at an angle in a range of 55°±5°.

A printer in accordance with an embodiment of the invention may have a liquid jet head in accordance with an embodiment of the invention.

DESCRIPTION OF EXEMPLARY EMBODIMENTS

Preferred embodiments of the invention are described below with reference to the accompanying drawings.

1. Piezoelectric Device and Liquid Ejection Head

A piezoelectric device in accordance with an embodiment is described with reference to an example in which the piezoelectric device is applied to a liquid ejection head for an ink jet recording head.

Figure 1:
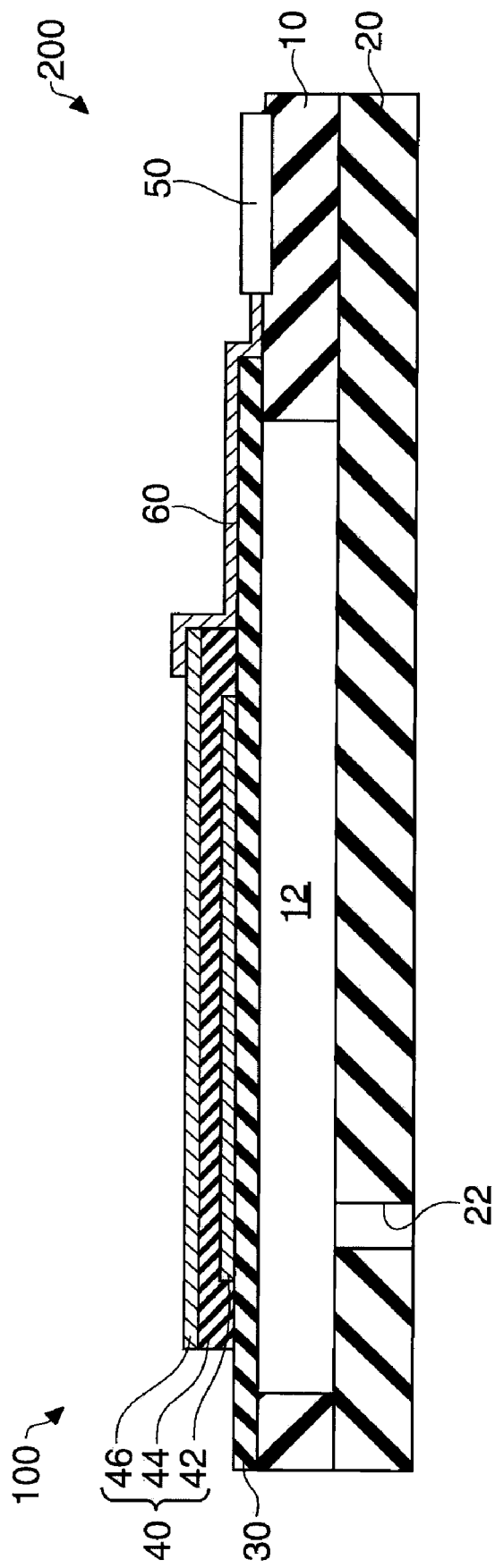
FIG. 1 is a schematic cross-sectional view of a liquid ejection head in accordance with an embodiment of the invention.
Figure 2:
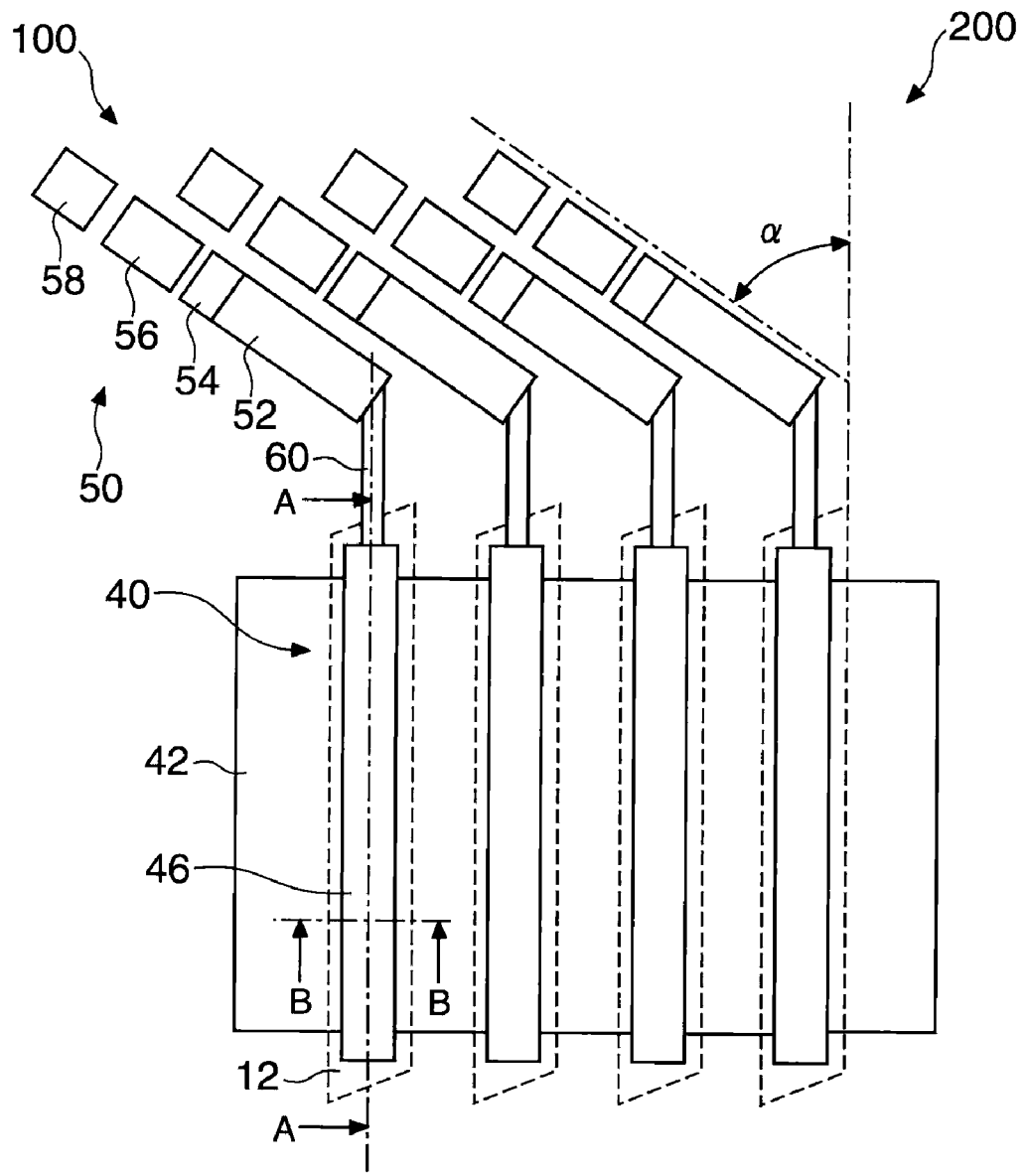
FIG. 2 is a schematic plan view of the liquid ejection head in accordance with the embodiment of the invention.
Figure 3:
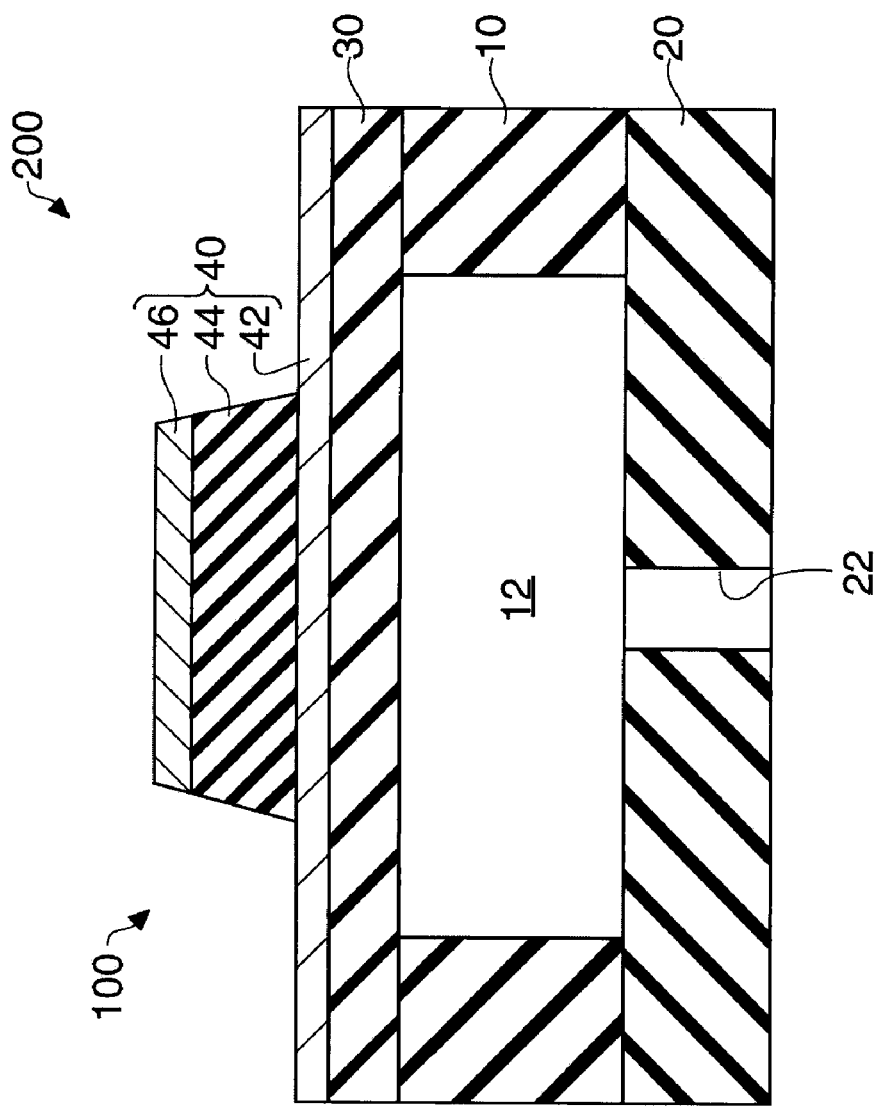
FIG. 3 is a schematic cross-sectional view of the liquid ejection head in accordance with the embodiment of the invention.
Figure 4:
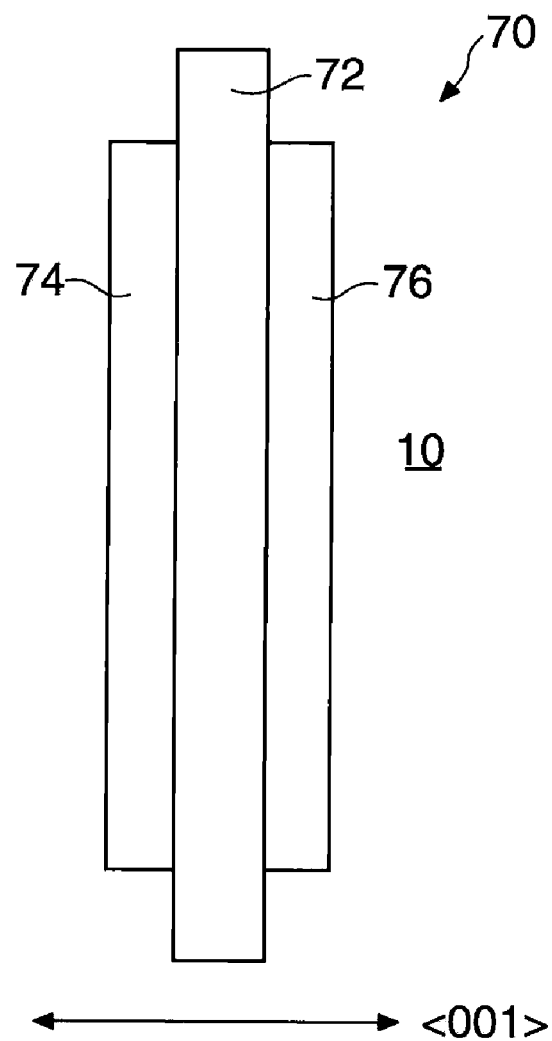
FIG. 4 is a schematic plan view of a transistor composing a driver IC of a liquid ejection head in accordance with an embodiment of the invention.

FIG. 1 is a schematic cross-sectional view of a liquid ejection head 200 in accordance with an embodiment of the invention. FIG. 2 is a schematic plan view of the liquid ejection head 200 in accordance with the present embodiment. FIG. 3 is a schematic cross-sectional view of the liquid ejection head 200 in accordance with the present embodiment. It is noted that FIG. 1 and FIG. 3 are cross sections taken along a line A-A and a line B-B in FIG. 2, respectively. FIG. 4 is a schematic plan view of a transistor 70 composing a driver IC 50 of the liquid ejection head 200 in accordance with the present embodiment.

The liquid ejection head 200 has, as shown in FIG. 1, a nozzle plate 20, a vibration plate 30, and a piezoelectric device 100. The piezoelectric device 100 includes a substrate 10, a piezoelectric element 40 and a driver IC 50. It is noted that FIG. 2 shows four pressure chambers 12 and four piezoelectric elements 40, but their number is not particularly limited to those of the illustrated embodiment.

The substrate 10 may be composed of a (110) single crystal silicon substrate. The (110) single crystal silicon is a single crystal silicon substrate whose substrate surface has a (110) crystal plane. The substrate 10 may have a pressure chamber 12. The substrate 10 may be accurately processed by anisotropic etching with a potassium hydroxide (KOH) solution.

The pressure chamber 12 may have a side surface that is a (111) plane perpendicular to the surface of the substrate 10. The pressure chamber 12 may be formed in a parallelogram, as shown in FIG. 2 in a plan view, with an angle defined by the long side and the short side being about 70°. The pressure chamber 12 is processed with high accuracy by anisotropic etching, whereby plural pressure chambers 12 can be arranged at high density.

The nozzle plate 20 may be formed from, for example, a (100) single crystal silicon substrate. The nozzle plate 20 has a nozzle aperture 22. The nozzle aperture 22 is formed in communication with the pressure chamber 12.

The vibration plate 30 is formed on the substrate 10. The vibration plate 30 may be formed from a laminate of layers of, for example, silicon oxide ($SiO_2$) and zirconium oxide ($ZrO_2$) successively laminated in this order. The thickness of the vibration plate 30 may be, for example, 1 μm-2 μm. The vibration plate 30 can be vibrated in an up-down direction by the piezoelectric element 40, whereby the volume of the pressure chamber 12 can be changed.

The piezoelectric element 40 is formed on the vibration plate 30. The piezoelectric element 40 is formed for each of the pressure chambers 12. The piezoelectric element 40 has a lower electrode 42, a piezoelectric layer 44, and an upper electrode 46.

The lower electrode 42 is formed on the vibration plate 30. The lower electrode 42 is one of the electrodes for applying a voltage to the piezoelectric layer 44. The lower electrode 42 is composed of, for example, platinum, iridium or conductive oxide of the foregoing metal. The lower electrode 42 may be in a single layer of any of the materials exemplified above, or a laminate of layers of the plural materials. The lower electrode 42 has a thickness of, for example, 50 nm-300 nm.

The piezoelectric layer 44 is formed on the lower electrode 42. The piezoelectric layer 44 is made of piezoelectric material of perovskite type oxide. The piezoelectric layer 44 may be composed of, for example, lead zirconate titanate (Pb (Zr, Ti) $O_3$: PZT). PZT that is used for the piezoelectric layer 44 may contain titanium and zirconium in a ratio of about 50% to 50% (Pb ($Zr_{0.5}$, $Ti_{0.5}$) $O_3$). The thickness of the piezoelectric layer 44 may be, for example, 300 nm-3000 nm. The piezoelectric layer 44 is preferentially oriented, for example, to (100) crystal orientation. It is noted that the statement "preferentially oriented to (100) crystal orientation" includes not only the case where the entire crystals are oriented to (100) crystal orientation, but also the case where, for example, 70% or more of the crystals are oriented to (100) crystal orientation. The crystal structure of the piezoelectric layer 44 may be, for example, a monoclinic structure. Also, the polarization direction of the piezoelectric layer 44 may be tilted at a predetermined angle with respect to a direction orthogonal to the film surface (i.e., the thickness direction of the piezoelectric layer 44), which is in an engineered domain arrangement.

The upper electrode 46 is formed on the piezoelectric layer 44. The upper electrode 46 is the other of the electrodes for applying a voltage to the piezoelectric layer 44. As the material for the upper electrode 46, the materials exemplified as the materials for the lower electrode 42 may be used. The thickness of the upper electrode 46 is, for example, 50 nm-300 nm.

The driver IC 50 is formed on the top surface side of the substrate 10. The driver IC 50 is formed directly in the substrate 10. In other words, according to the present embodiment, a driver IC that may be formed on an independent chip is not bonded to the substrate 10, but the driver IC 50 is formed directly in the substrate 10.

As shown in FIG. 2, the driver IC 50 may have an analog switch 52 with a transistor 70, a level shifter 54, a logic control IC 56 and a pad 58. The driver IC 50 drives the piezoelectric element 40. More specifically, the piezoelectric element 40 applies a drive voltage between the lower electrode 42 and the upper electrode 46 in response to a drive signal from the driver IC 50. The drive voltage drives the piezoelectric element 40, which causes a displacement in the vibration plate 30 which then changes the volume of the pressure chamber 12, whereby liquid is ejected from the nozzle aperture 22. As the driver IC 50 is formed in the substrate 10, the liquid jet head 200 can be more readily reduced in size, compared to the case where an independently formed driver IC is formed, for example, in a silicon sealed substrate and mounted on a substrate.

The driver IC 50 may be in a rectangular shape having a long side and a short side as viewed in a plan view. The driver IC 50 is formed with the long side being oriented in parallel with [1-10] orientation of the substrate 10. The angle defined between the [1-10] orientation and the [1-12] orientation is about 55°. In other words, the driver IC 50 is formed in a manner that an extension line of the long side of the driver IC 50 and an extension line of the long side of the pressure chamber 12 intersect at an angle (the angle α shown in FIG. 2) of about 55°. As a result, as described below, the transistor 70 composing the analog switch 52 (see FIG. 4) can be formed with its channel direction being in a direction in which the electron mobility on the substrate 10 becomes maximum. It is noted that the angle defined by the long side of the driver IC 50 and the long side of the pressure chamber 12 may not strictly be about 55°, but may be in a range of ±5° of that angle, whereby the same or similar effects can be obtained.

As shown in FIG. 4, the transistor 70 is formed on a (110) crystal plane which is the top surface side of the substrate 10. The transistor 70 composes the analog switch 52 provided at the driver IC 50. The analog switch 52 functions as a switch to control as to whether a drive voltage is to be applied to the piezoelectric element 40 based on drive signals. The transistor 70 may be a field effect transistor. The transistor 70 has a gate electrode 72, a source 74 and a drain 76. As shown in FIG. 2, the transistor 70 is disposed with its channel direction being in a direction orthogonal to the long side of the driver IC 50. The gate length of the transistor 70 is, for example, about 5 μm, and the gate width thereof may be about 300 μm.

The transistor 70 may be formed with its channel direction being in <001> crystal orientation of the substrate 10. The transistor 70 may be formed, for example, with its channel direction being in parallel with [001] orientation of a (110) crystal plane which is the top surface of the substrate 10. In the (110) crystal plane, the electron mobility in the <001> orientation becomes maximum. More specifically, in the (110) crystal plane, the electron mobility in the <001> orientation is 0.095 $m^2$/Vs, which is about 1.5 times higher than the electron mobility in the <110> orientation in which the electron mobility becomes minimum. As the transistor 70 is formed with its channel direction being in the <001> orientation in which the electron mobility on the substrate 10 becomes maximum, which can lower the resistance value, and better suppress the heat generation, compared to the case where the channel direction is formed to be in other orientations. Therefore, the driver IC 50 having the transistor 70 is highly efficient and highly reliable. It is noted that the channel direction may be within a range of ±5° with respect to the <001> orientation of the substrate 10, whereby the same or similar effects can be obtained.

A wiring 60 electrically connects the driver IC 50 with the piezoelectric element 40. More specifically, the wiring 60 electrically connects the driver IC 50 to the upper electrode 46 of the piezoelectric element 40. As the driver IC 50 is formed in the substrate 10, the wiring 60 can be formed by a known semiconductor manufacturing process, such as, a sputter method, a plating method or the like. Accordingly, the liquid jet head 200 can be reduced in size, as bonding wires are not required.

The liquid jet head 200 has, for example, the following characteristics.

The piezoelectric device 100 can have the driver IC 50 formed in the substrate 10. Therefore, the wiring 60 that electrically connects the driver IC with the piezoelectric element 40 can be formed by a known semiconductor manufacturing process. Accordingly, the piezoelectric device 100 does not require the step for forming bonding wires, and thus can be formed by a low cost and simple process, and can be readily reduced in size.

In the piezoelectric device 100, the transistor 70 composing the analog switch 52 is formed with its channel direction being in the <001> orientation of the substrate 10. In other words, the transistor 70 is formed with its channel direction being in a direction in which the electron mobility on the substrate 10 becomes maximized. Compared to the case where the channel direction is formed in other orientations, the transistor 70 has a lower resistance value, such that heat generation can be suppressed. Therefore, the driver IC 50 having the transistor 70 exhibits high efficiency and high reliability.

The piezoelectric device 100 is formed in a manner that the extension line of the long side of the driver IC 50 and the extension line of the long side of the pressure chamber 12 cross at an angle of about 55±5°. As a result, the transistor 70 composing the analog switch 52 of the driver IC 50 can be formed with its channel direction being in a direction in which the electron mobility becomes maximized. Accordingly, the driver IC 50 having the transistor 70 exhibits high efficiency and high reliability.

2. Method for Manufacturing Piezoelectric Device and Liquid Jet Head

Figure 5:
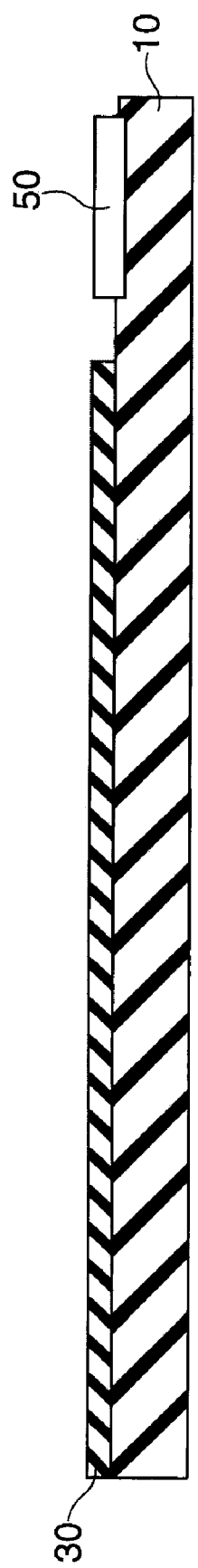
FIG. 5 is a schematic cross-sectional view showing a step in manufacturing a liquid ejection head in accordance with an embodiment of the invention.
Figure 6:
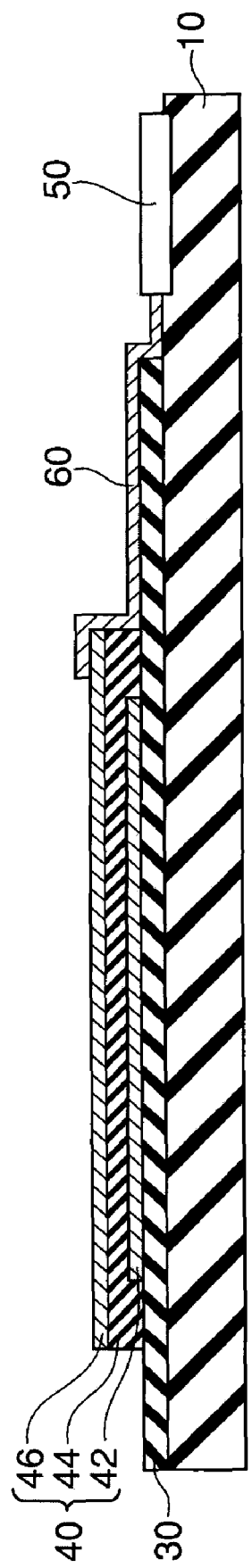
FIG. 6 is a schematic cross-sectional view showing a step in manufacturing a liquid ejection head in accordance with the embodiment of the invention.

Next, a liquid jet head 200 in accordance with an embodiment of the invention that uses the piezoelectric device 100 in accordance with the present embodiment is described with reference to the accompanying drawings. FIG. 5 and FIG. 6 are schematic cross-sectional views showing the steps for manufacturing the liquid jet head 200 in accordance with the present embodiment.

As shown in FIG. 5, a driver IC 50 and a vibration plate 30 are formed on the top surface side of the substrate 10. The driver IC 50 may be formed by, for example, a known method. The driver IC 50 may be manufactured as a MEMS (Micro Electro Mechanical System) using a semiconductor manufacturing technology. In other words, the driver IC 50 is formed directly in the substrate 10, instead of, for example, through forming a driver IC on an independent chip and bonding the same to the substrate 10. The driver IC 50 is provided with an analog switch 52. A transistor 70 composing the analog switch 52 may be formed by a known method.

The vibration plate 30 may be formed by sequentially laminating layers of silicon oxide and zirconium oxide in this order. The layer of silicon oxide may be formed by, for example, a sputter method or a thermal oxidation method. The layer of zirconium oxide may be formed by, for example, a sputter method.

As shown in FIG. 6, a piezoelectric element 40 is formed on the vibration plate 30. The piezoelectric element 40 is formed by laminating layers for a lower electrode 42, a piezoelectric layer 44 and an upper electrode 46 in this order.

The lower electrode 42 and the upper electrode 46 may be formed by, for example, a sputter method, a plating method, or a vacuum deposition method.

The piezoelectric layer 44 may be formed by, for example, a sol-gel method or a sputter method. Sintering temperatures for forming the piezoelectric layer 44 may be, for example, about 700° C.

Next, a wiring 60 that electrically connects the upper electrode 46 with the driver IC 50 is formed. The wiring 60 may be formed on the top surface and side surface of the upper electrode 46, the side surface of the piezoelectric layer 44, the top surface of the vibration plate 30 and the top surface of the substrate. The wiring 60 may be formed by a known semiconductor manufacturing process, such as, a sputter method, a plating method or the like.

As shown in FIG. 1, a pressure chamber 12 is formed in the substrate 10. The pressure chamber 12 may be formed by anisotropic etching with a potassium hydroxide (KOH) solution. Anisotropic etching is conducted, taking advantage of the characteristic in that the etching rate for (111) plane is very small compared to the etching rate for (110) plane, such that the (111) plane is hardly etched. Concretely, when the substrate 10 is anisotropically etched, etching of the (110) plane advances in the thickness direction of the substrate 10, and the (111) plane that is perpendicular to the surface of the substrate 10 appears, whereby the pressure chamber 12 is formed. Etching of the substrate 10 in its thickness direction is regulated by the vibration plate 30 that acts as an etching stopper layer. The (111) plane that is perpendicular to the surface of the substrate 10 forms the side surface of the pressure chamber 12. The pressure chamber 12 can be accurately formed in a parallelogram shape, as viewed in a plan view, whose acute angle defined by a long side formed from a (111) plane and a short side formed from another (111) plane is about 70°. The pressure chambers 12 can be accurately processed by anisotropic etching, such that they can be arranged at high density.

Next, the substrate 10 and a nozzle plate 20 having nozzle apertures 22 are bonded together. The nozzle apertures 22 may be formed by patterning the nozzle plate 20. Patterning may be conducted by, for example, known photolithography technique and etching technique. Bonding may be achieved by, for example, bonding with known adhesive or welding.

By the steps described above, the liquid jet head 200 having the piezoelectric device 100 is manufactured.

According to the method for manufacturing a piezoelectric device 100, the driver IC 50 is formed in the substrate 10. Therefore, the wiring 60 can be formed by a known semiconductor process, such that the piezoelectric device 100 can be formed by a low cost and simple process, and can be readily made smaller in size.

According to the method for manufacturing a piezoelectric device 100, the substrate 10 may be formed from a (110) single crystal silicon substrate. Therefore, the substrate 10 can be accurately processed by anisotropic etching with potassium hydroxide. Accordingly, in the piezoelectric device 100, the pressure chambers 12 can be formed at high density.

3. Printer

Next, a printer that uses a liquid jet head having piezoelectric devices in accordance with the invention shall be described. The embodiment is described here using an example in which a printer 300 in accordance with the present embodiment is an ink jet printer.

Figure 7:
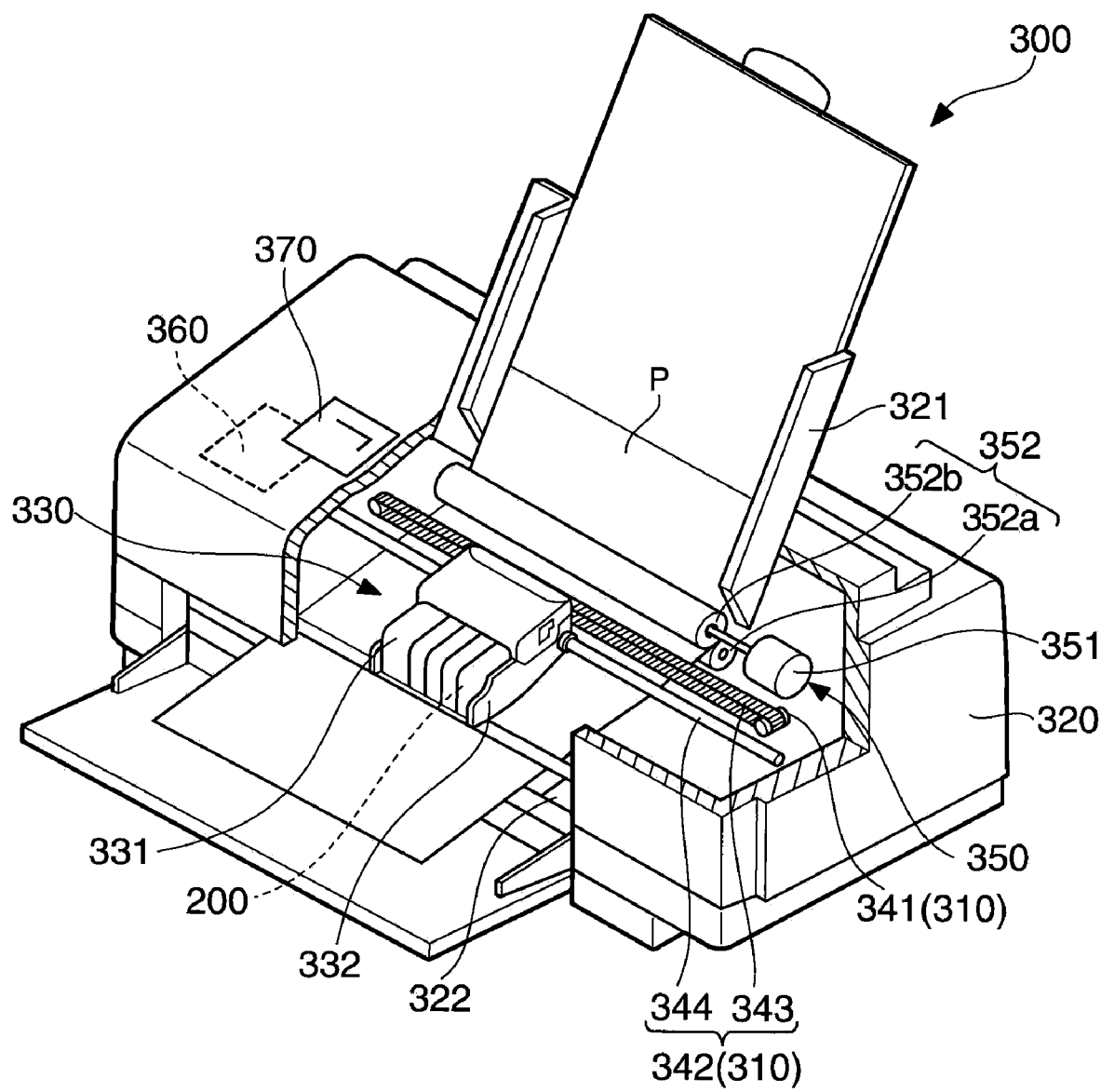
FIG. 7 is a schematic perspective view of a printer in accordance with an embodiment of the invention.

FIG. 7 is a schematic perspective view of the printer 300 in accordance with the present embodiment.

The printer 300 includes a head unit 330, a driving section 310, and a controller section 360. Also, the printer 300 may include an apparatus main body 320, a paper feed section 350, a tray 321 for holding recording paper P, a discharge port 322 for discharging the recording paper P, and an operation panel 370 disposed on an upper surface of the apparatus main body 320.

The head unit 330 includes an ink jet recording head (hereafter simply referred to as the "head") that is formed from liquid jet heads 200 in accordance with the embodiment described above. The head unit 330 is further equipped with ink cartridges 331 that supply inks to the head, and a transfer section (carriage) 332 on which the head and the ink cartridges 331 are mounted.

The driving section 310 is capable of reciprocally moving the head unit 330. The driving section 310 includes a carriage motor 341 that is a driving source for the head unit 330, and a reciprocating mechanism 342 that receives rotations of the carriage motor 341 to reciprocate the head unit 330.

The reciprocating mechanism 342 includes a carriage guide shaft 344 with its both ends being supported by a frame (not shown), and a timing belt 343 that extends in parallel with the carriage guide shaft 344. The carriage 332 is supported by the carriage guide shaft 344, in a manner that the carriage 332 can be freely reciprocally moved. Further, the carriage 332 is affixed to a portion of the timing belt 343. By operations of the carriage motor 341, the timing belt 343 is moved, and the head unit 330 is reciprocally moved, guided by the carriage guide shaft 344. During these reciprocal movements, ink is jetted from the head and printed on the medium P.

The control section 360 can control the head unit 330, the driving section 310 and the paper feeding section 350.

The paper feeding section 350 can feed the recoding paper P from the tray 321 toward the head unit 330. The paper feeding section 350 includes a paper feeding motor 351 as its driving source and a paper feeding roller 352 that is rotated by operations of the paper feeding motor 351. The paper feeding roller 352 is equipped with a follower roller 352a and a driving roller 352b that are disposed up and down and opposite to each other with a feeding path of the recording paper P being interposed between them. The driving roller 352b is coupled to the paper feeding motor 351. When the paper feeding section 350 is driven by the control section 360, the recording paper P is fed in a manner to pass below the head unit 330.

The head unit 330, the driving section 310, the control section 360 and the paper feeding section 350 are provided inside the apparatus main body 320.

The printer 300 has, for example, the following characteristics.

The printer 300 may have a piezoelectric device 100 in accordance with an embodiment of the invention. The piezoelectric device 100 in accordance with the embodiment is highly reliable, and can be manufactured by a low cost and simple process. Therefore, the printer 300 that is highly reliable and can be manufactured by a low cost and simple process can be obtained.

It is noted that, in the example described above, the case where the printer 300 is an ink jet printer is described. However, the printer in accordance with the invention may also be used as an industrial liquid ejection device. Liquid (liquid material) that may be ejected in this case may be liquid composed of any one of various kinds of functional materials whose viscosity is appropriately adjusted with a solvent or a dispersion medium.

Also, the piezoelectric device in accordance with the invention is also applicable to, for example, a color material ejection head that is used for manufacturing color filters for liquid crystal displays, an electrode material ejection head that is used for forming electrodes for organic EL displays, EFDs (field emission displays) and the like, and a bioorganic material jet head used for manufacturing bio-chips.

The embodiments of the invention are described above in detail. However, those skilled in the art should readily understand that many modifications can be made without departing in substance from the novel matter and effects of the invention. Accordingly, all of those modified examples are deemed to be included in the scope of the invention.

What is claimed is:

1. A liquid ejection head comprising:
   a pressure chamber formed in a substrate, the pressure chamber communicating with a nozzle;
   a vibration plate formed on the substrate over the pressure chamber in a first area of the substrate;
   a driver circuit formed in the substrate in a second area of the substrate separate from the first area of the substrate; and
   a piezoelectric device formed on the vibration plate,
   wherein electrodes of the piezoelectric device are connected to the driver circuit via wiring formed on the substrate and on the vibration plate, and wherein the driver circuit has a transistor and the transistor has a channel direction in a <001> orientation of the substrate.

2. A liquid ejection head according to claim 1, wherein the channel direction of the transistor is in a range of ±5° with respect to the <001> orientation of the substrate.

3. A liquid ejection head according to claim 1, wherein the driver circuit has a long side and a short side in a plan view, and the long side of the driver circuit is orthogonal to the channel direction of the transistor.

4. A liquid ejection head according to claim 1, wherein the pressure chamber and the driver circuit each have a long side and a short side as viewed in a plan view, and wherein an extension line of the long side of the pressure chamber and an extension line of the long side of the driver circuit cross at an angle in a range of 55°±5°.

5. A printer comprising the liquid ejection head recited in claim 1.

6. A liquid ejection head according to claim 1, wherein the wiring is formed on a top surface and a side surface of the piezoelectric device and on a top surface and a side surface of the vibration plate.

7. A method for manufacturing a liquid ejection head, the method comprising the steps of:
   forming a pressure chamber in a substrate;
   forming a vibration plate on the substrate over the pressure chamber in a first area of the substrate;
   forming a driver circuit in the substrate in a second area of the substrate separate from the first area; and
   forming a piezoelectric device on the vibration plate,
   wherein electrodes of the piezoelectric device are connected to the driver circuit via wiring formed on the substrate and on the vibration plate, and
   wherein the driver circuit has a transistor and the transistor has a channel direction in a <001> orientation of the substrate.

* * * * *